United States Patent [19]

Sano et al.

[11] Patent Number: 5,778,485
[45] Date of Patent: Jul. 14, 1998

[54] PROBE CARD CLEANING APPARATUS, PROBE APPARATUS WITH THE CLEANING APPARATUS, AND PROBE CARD CLEANING METHOD

[75] Inventors: Kunio Sano, Yamanashi-ken; Satoru Yamashita, Kofu, both of Japan

[73] Assignee: Tokyo Electron Limited, Tokyo, Japan

[21] Appl. No.: 567,168

[22] Filed: Dec. 5, 1995

[30] Foreign Application Priority Data

Jan. 19, 1995 [JP] Japan ................................. 7-024688

[51] Int. Cl.[6] ........................................................ B08B 3/10
[52] U.S. Cl. ............................ 15/301; 15/379; 15/404
[58] Field of Search ........................... 15/379, 381, 403, 15/404, 301

[56] References Cited

U.S. PATENT DOCUMENTS 2,637,873  5/1953  Berezny .............................. 15/405 X
3,897,605  8/1975  Dickinson ........................... 15/405 X
5,329,665  7/1994  Thayer et al. ...................... 15/404 X
5,377,381  1/1995  Wilson ................................. 15/304
5,438,729  8/1995  Powell ................................. 15/304

FOREIGN PATENT DOCUMENTS 57-59668   12/1982   Japan.
6194347    6/1986    Japan.

Primary Examiner—Chris K. Moore
Attorney, Agent, or Firm—Oblon, Spivak, McClelland, Maier & Neustadt, P.C.

[57] ABSTRACT

A cleaning apparatus for cleaning a probe card having a contact element to be brought into electrical contact with a pad of a circuit to be inspected, comprises a conductive brush to be brought into contact at least with the contact element to clean the probe card, and a gas blow mechanism for intermittently blowing gas to the brush. The conductive brush is vibrated by the gas blow, and a particle adhered from the probe card is removed by the vibrating brush and the gas jet.

9 Claims, 18 Drawing Sheets

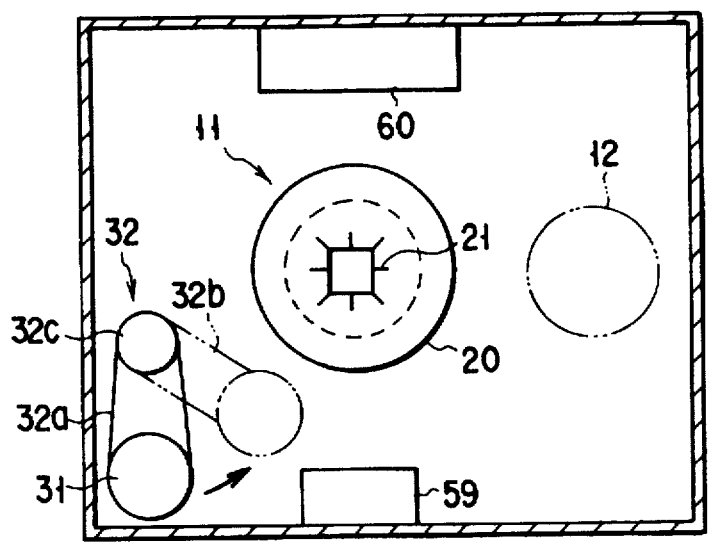
F I G. 3
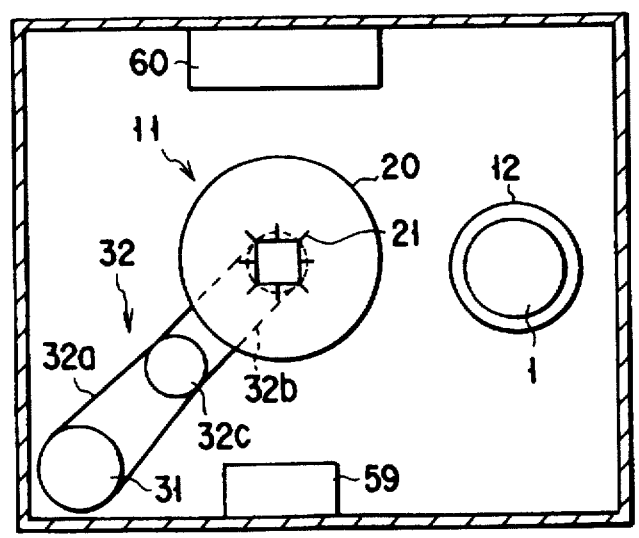
F I G. 4

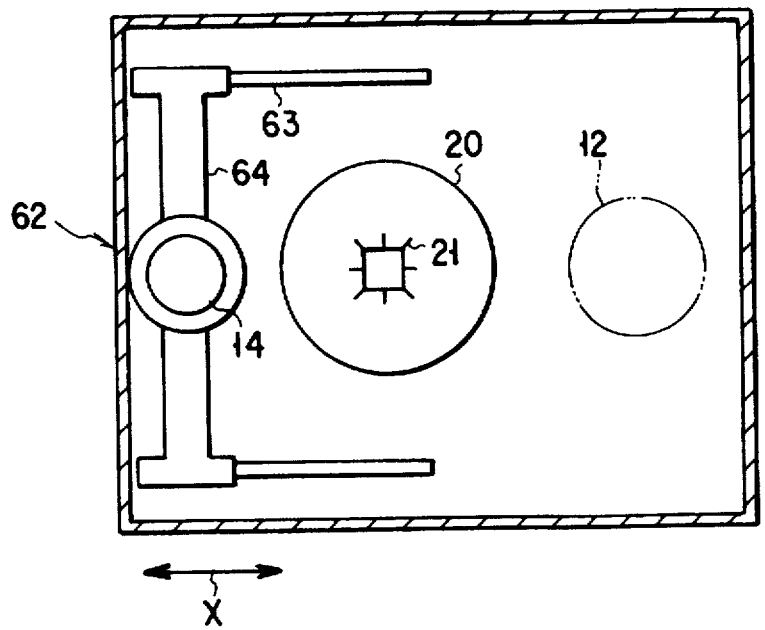
F I G. 9
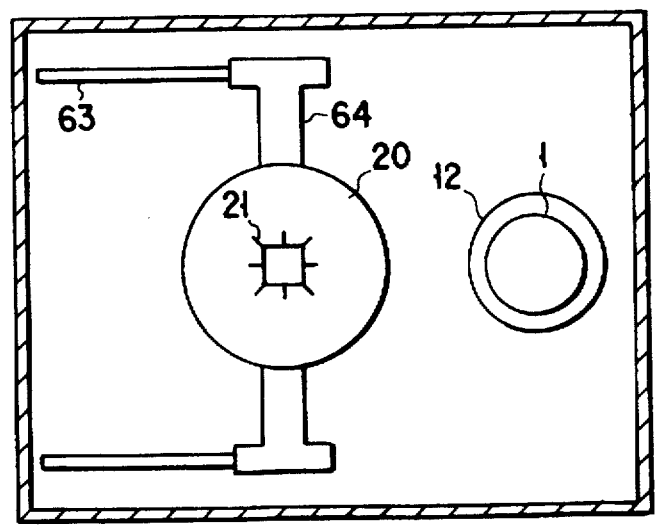
F I G. 10

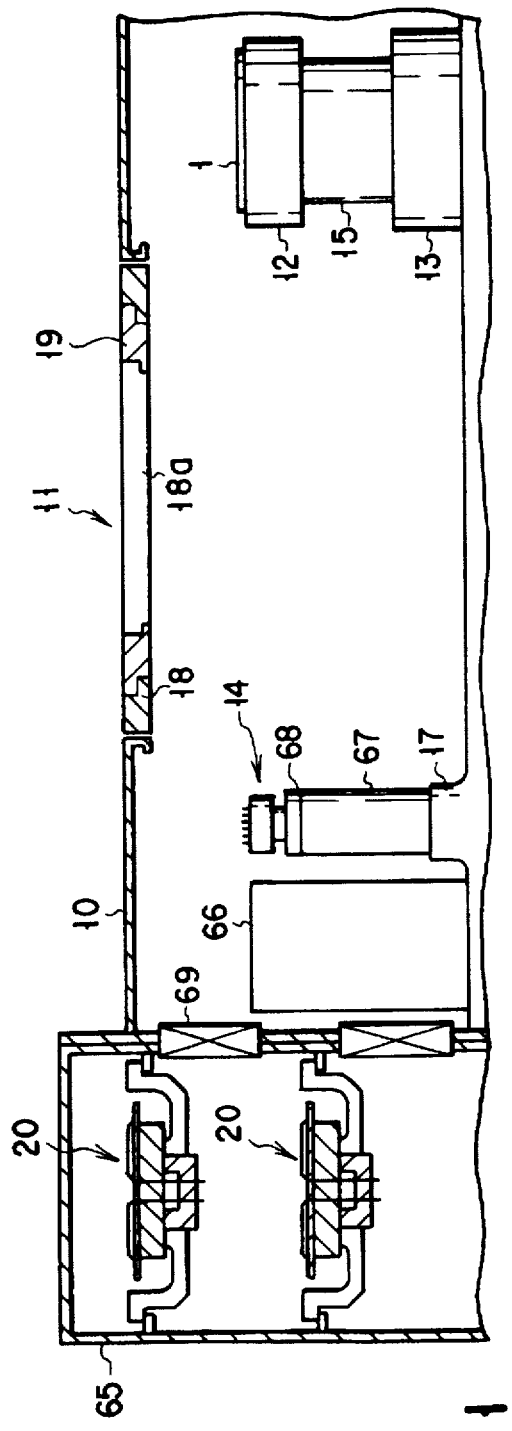
F I G. 11
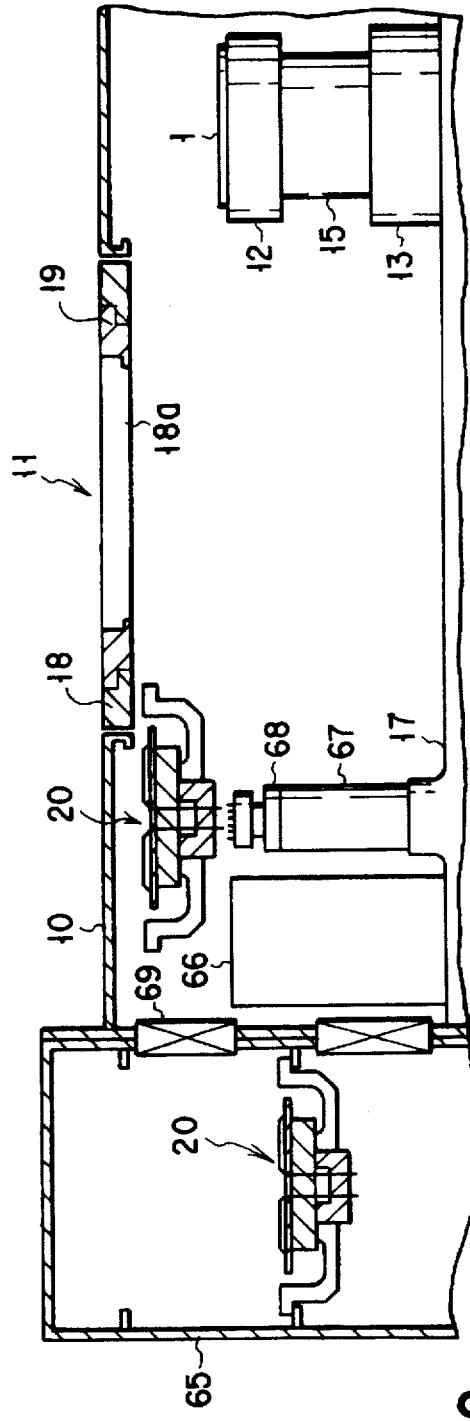
F I G. 12

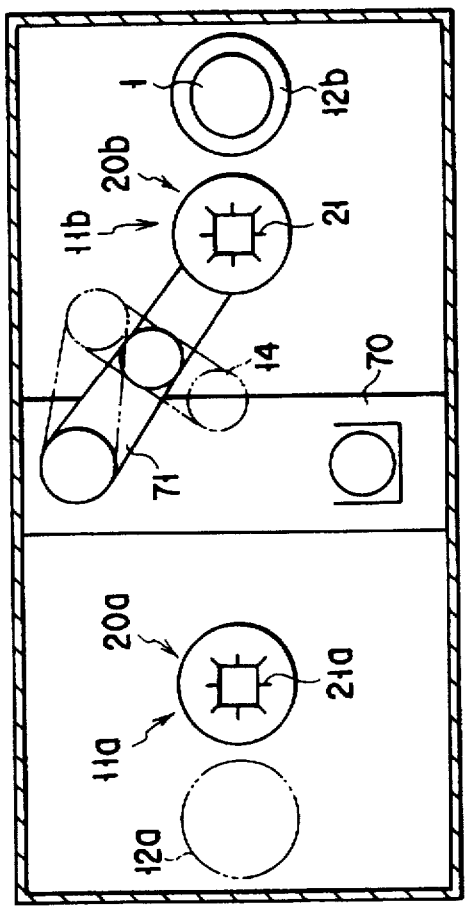
F I G. 15
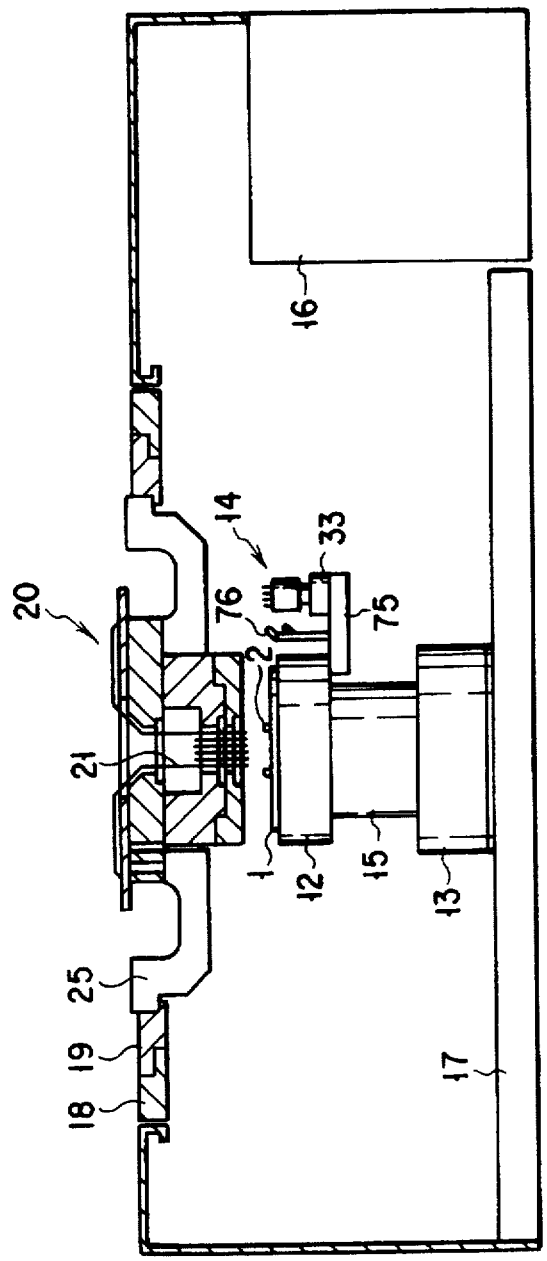
F I G. 16

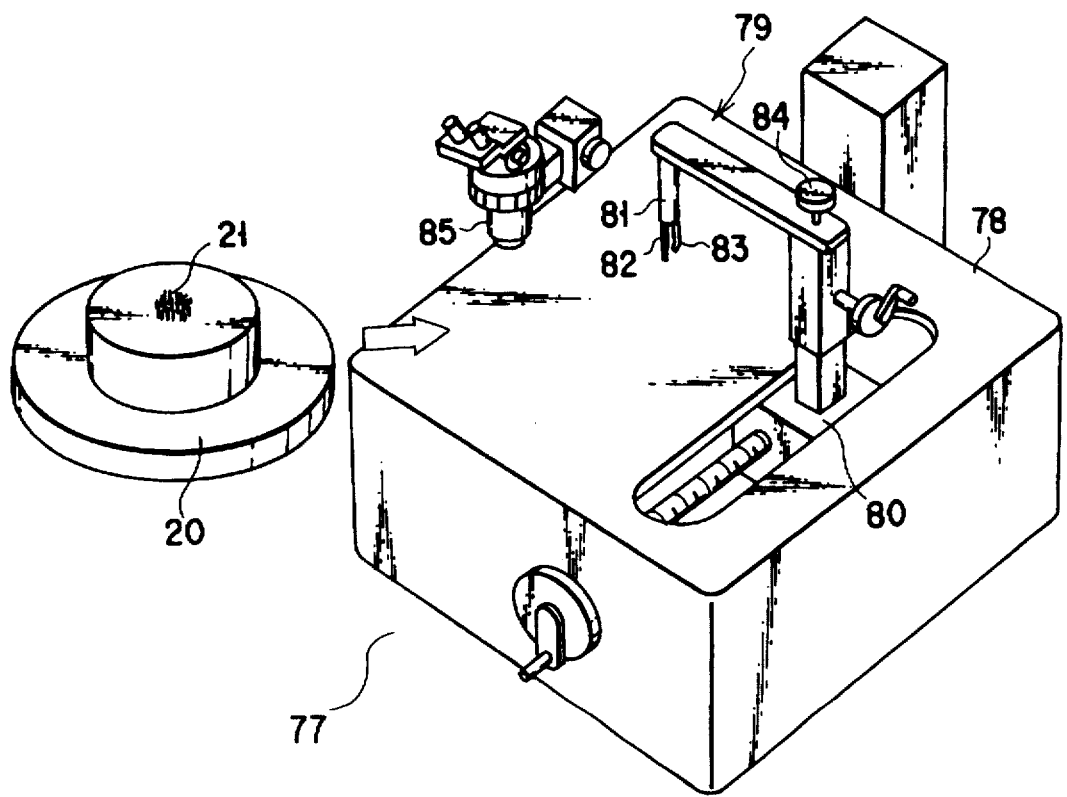
F I G. 19
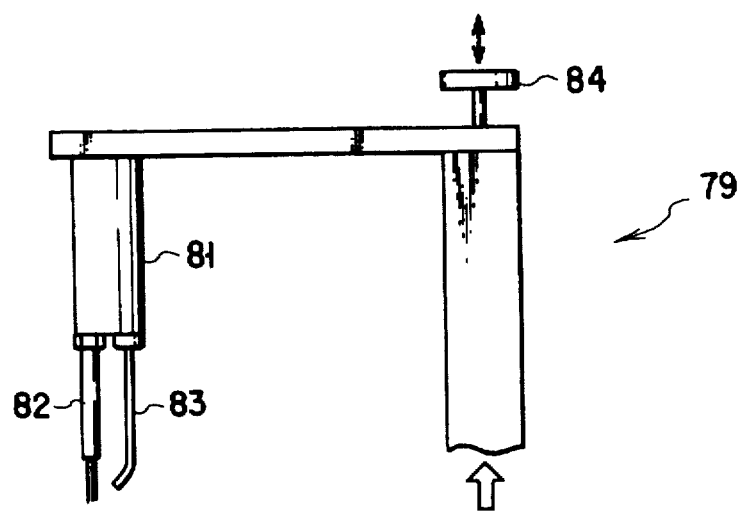
F I G. 20

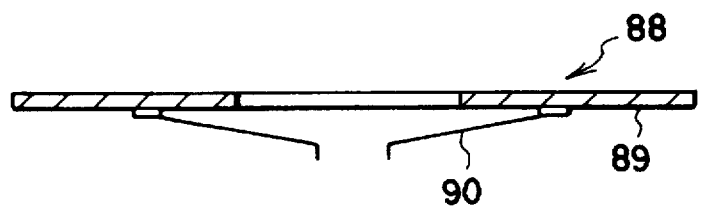
F I G. 21
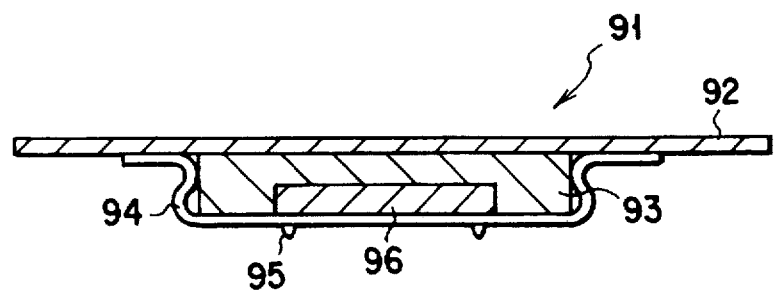
F I G. 22
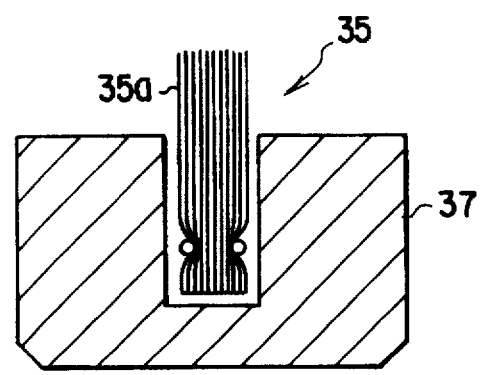
F I G. 23

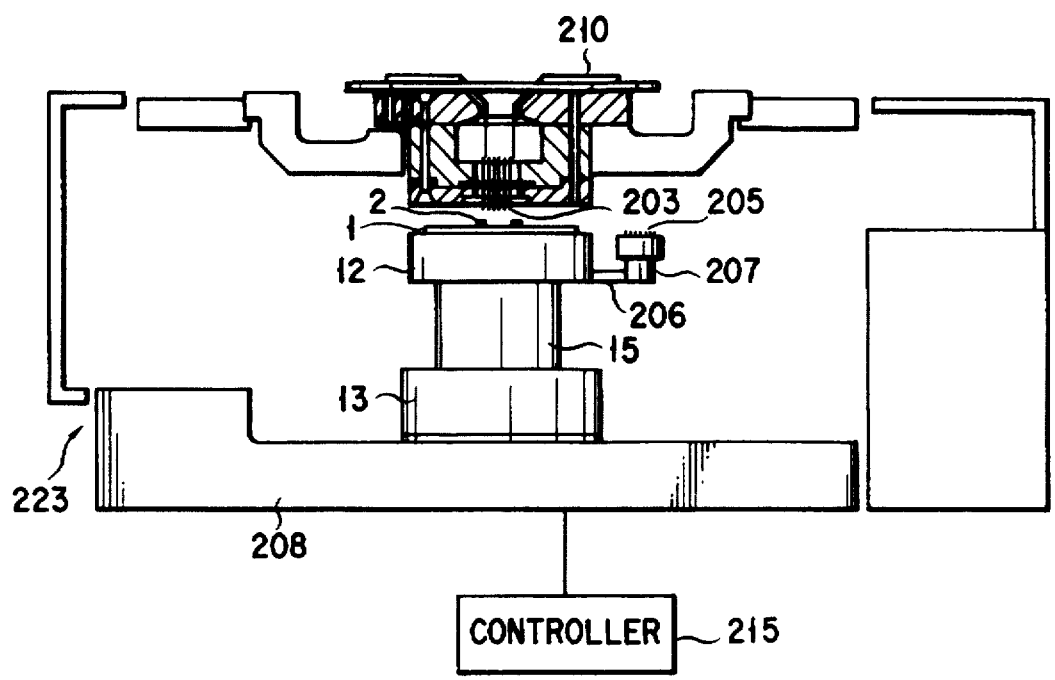
F I G. 25
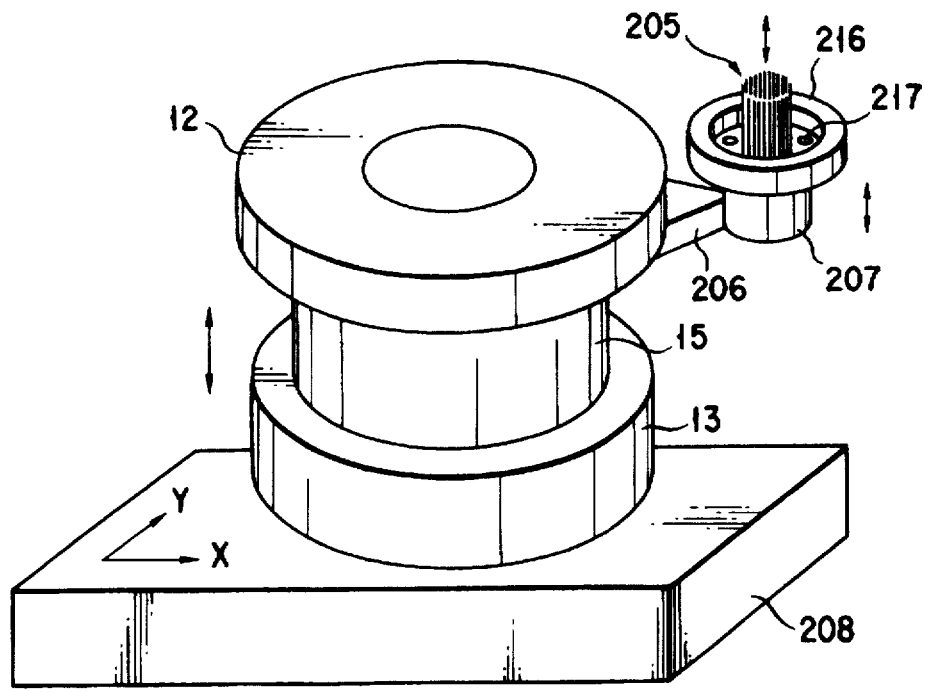
F I G. 26

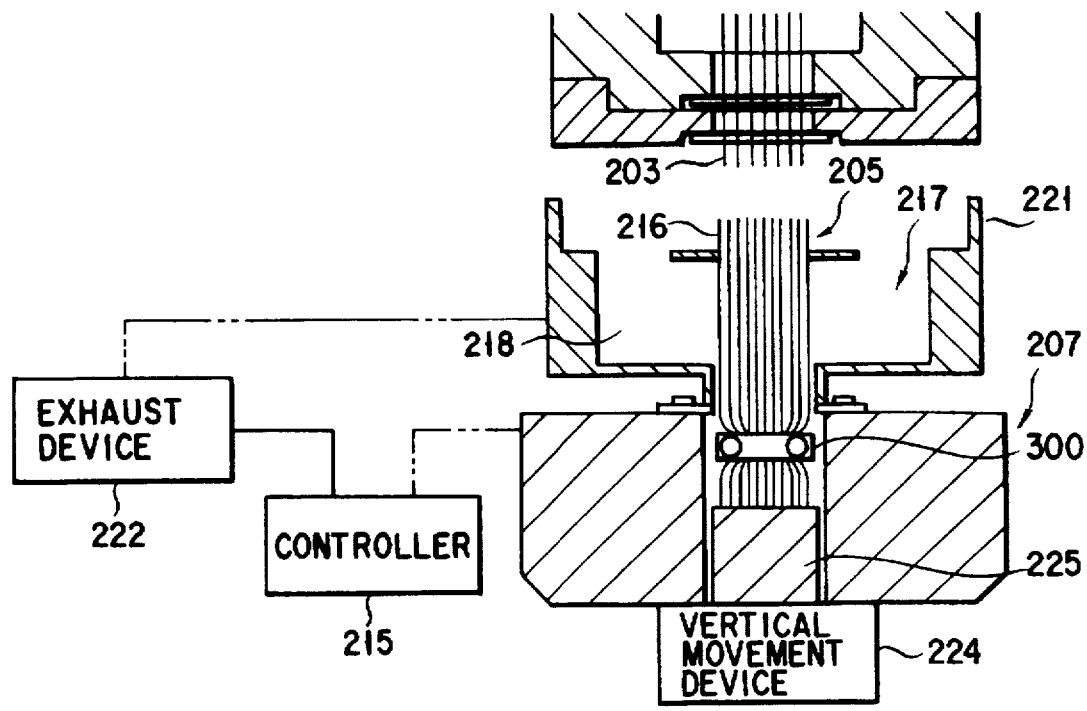
F I G. 27A
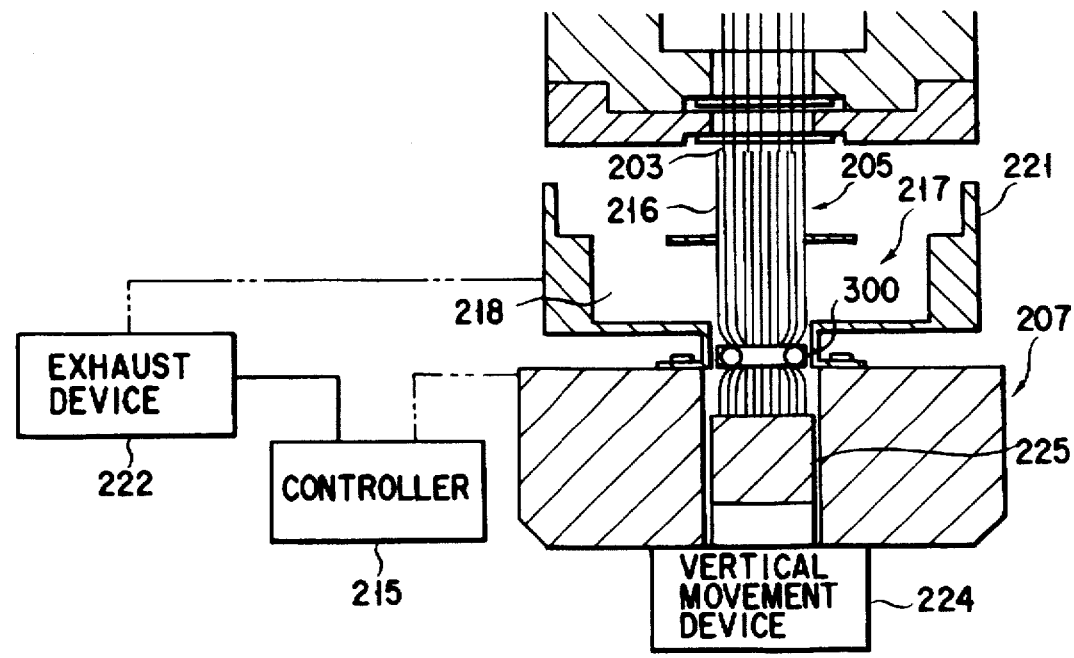
F I G. 27B

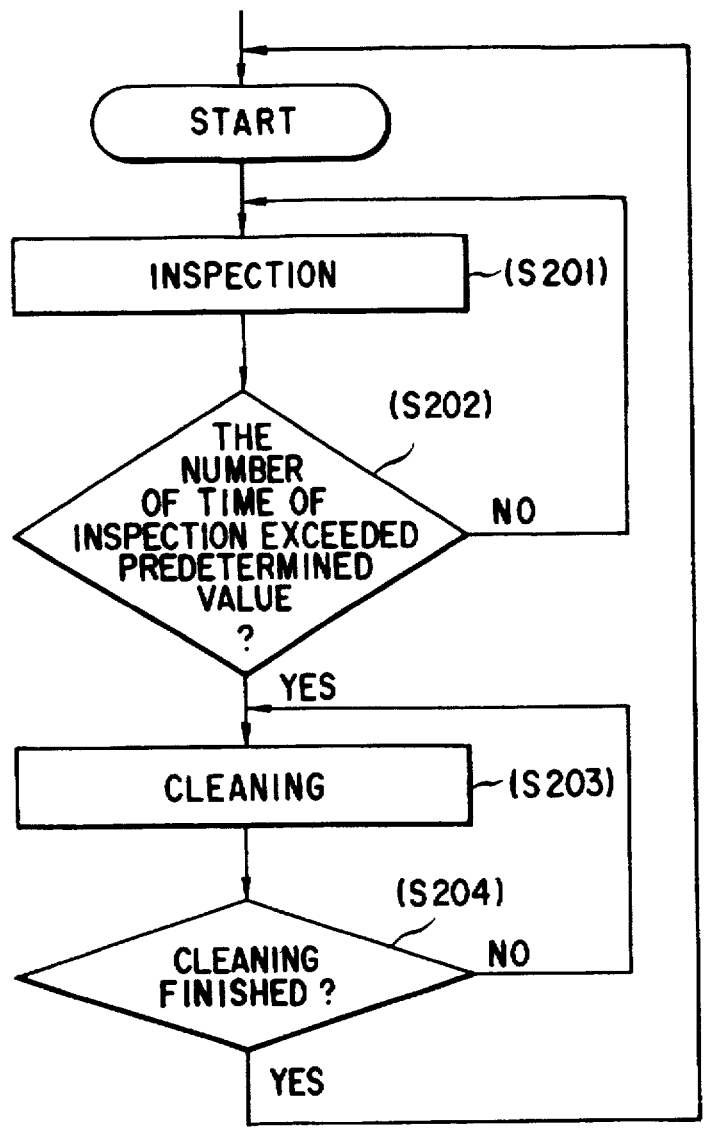
F I G. 30

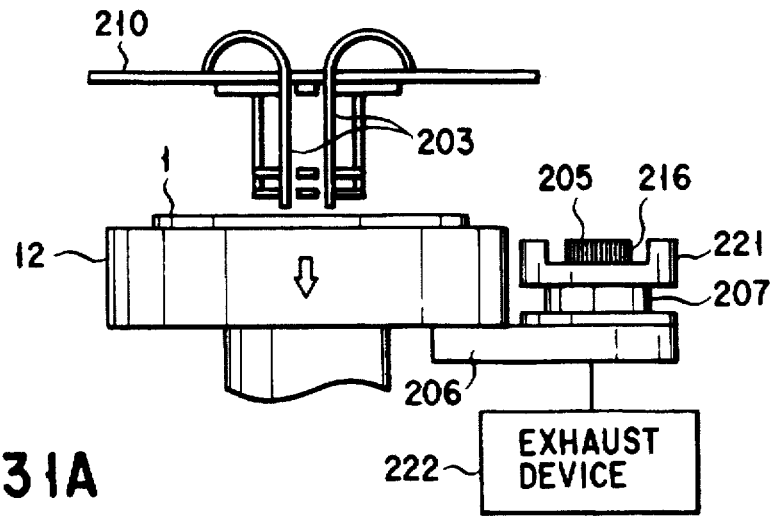
F I G. 31A
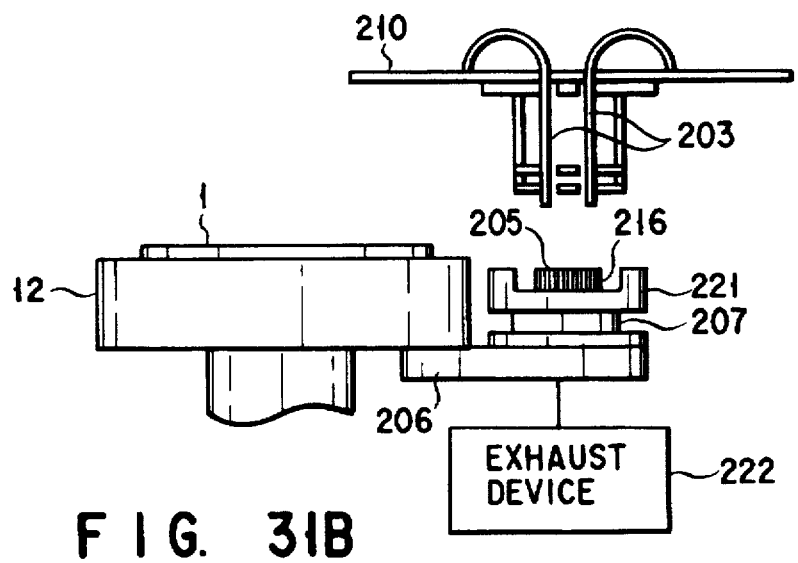
F I G. 31B
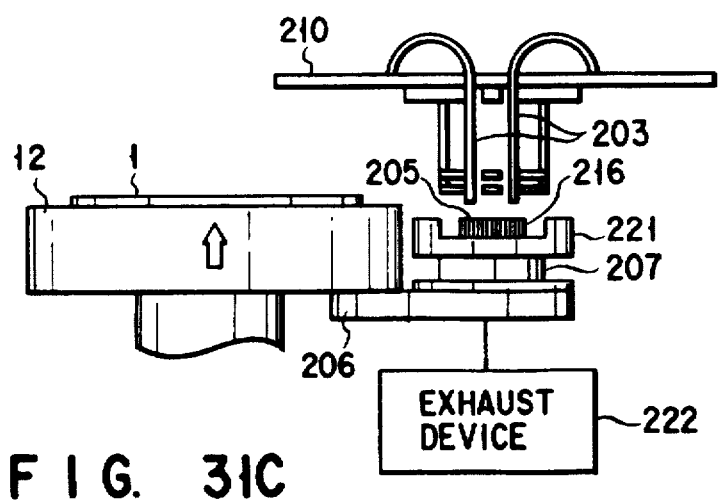
F I G. 31C

PROBE CARD CLEANING APPARATUS, PROBE APPARATUS WITH THE CLEANING APPARATUS, AND PROBE CARD CLEANING METHOD

BACKGROUND OF THE INVENTION

1. Field of the Invention

This invention relates to an apparatus and a method for cleaning probe cards, and a probe apparatus having the cleaning apparatus.

2. Description of the Related Art

In the manufacture of semiconductor devices, a multiple of semiconductor devices are formed on a semiconductor wafer, and then the wafer is divided into portions to separate the semiconductor devices from each other. Before dividing the wafer, in general, the electric characteristics of each semiconductor device as a semi-finish part is inspected by means of a probe apparatus.

The probe apparatus incorporates a probe card with a multiple of probes which can be brought into contact with the electrode pads of semiconductor devices on a semiconductor wafer. Probe cards are typically classified into inclination type ones and vertical type ones. In the case of the inclination type probe card, probes are radially arranged on a substrate (a laminate plate) at an angle of 7° to the surface of the substrate. In the case of the vertical type probe card, a guide plate is provided parallel to the substrate (laminate plate) so that probes can be arranged perpendicular to the surface of the wafer.

In both the inclination type probe card and the vertical type probe card, dust (e.g. particles of aluminum) gets up from the wafer during probing, and partially sticks to the probe card. In the vertical probe card, for example, such dust sticks to the bottom surface (opposed to the upper surface of the wafer) of the insulated guide plate which guides the probes of the probe card. Thus, dust deposits each time the probing is performed, which may well degrade the electrical insulation properties of the probe.

To avoid this, a technique for removing such adhered dust by applying air thereto has been employed so far. Japanese Utility Model Application Publication KOKAI No. 63-75041 discloses an inclination type probe card which employs the technique for removing dust by applying air. This technique, however, is not always valid for the vertical type probe card.

In camera industry, a lens cleaning brush as shown in FIG. 24 is used to clean lenses. The lens cleaning brush 100 removes dust 104 adhered to a lens 103 by applying air to the lens through a nozzle 102 provided among filaments 101.

It is considered to apply the lens cleaning brush 100 to the vertical type probe card. In this case, dust adhered to the bottom surface of the guide plate of the probe card can be removed by swinging the tip portions of the filaments of the brush on the guide plate by means of a driving unit.

However, the vertical type probe card has a fine structure in which each probe has a diameter of 70 microns at its thick portion and a diameter of 20 microns at its tip portion, and adjacent probes are separated from each other by 100 microns. Therefore, only a small force can damage the probes. Moreover, the swing operation may cause tip portions of the filaments to get entangled, and the entangled filaments may catch and bend the probes during further swing operation.

In addition, where the above-described brush is used to clean the probes, static electricity may occur due to friction between the probe card and the guide plate, since the filaments of the brush are generally made of a resin or hair of an animal. It is possible that the static electricity is discharged when the probes have been brought into contact with a semiconductor device to be inspected, and that the semiconductor device is seriously damaged.

SUMMARY OF THE INVENTION

The present invention has been developed under the above-described circumstances.

It is a first object of the invention to provide a probe card cleaning apparatus capable of effectively removing dust adhered to part of a probe card, such as a probe or a guide plate, using a brush without damaging the probes.

It is a second object of the invention to provide a probe card cleaning apparatus capable of effectively removing, using a brush, dust adhered to part of a probe card, such as a probe or a guide plate, even if only a small space is defined between adjacent ones of a multiple of probes.

It is a third object of the invention to provide a highly-maintainable probe apparatus with a cleaning apparatus.

It is a fourth object of the invention to provide a probe apparatus with a cleaning apparatus, capable of efficient cleaning.

It is a fifth object of the invention to provide a probe card cleaning apparatus capable of minimizing the possibility of charging probe card with static electricity.

It is a sixth object of the invention to provide a probe card cleaning apparatus capable of removing static electricity from the probe card.

According to a first aspect of the invention, there is provided a cleaning apparatus for cleaning a probe card having a contact element to be brought into electrical contact with a pad of a circuit to be inspected, comprising: a brush unit having a multiple of filaments to be brought into contact at least with the contact element to clean the probe card; and a gas blow mechanism for intermittently blowing gas to the brush unit; wherein the filaments are vibrated by the gas blown from the gas jet mechanism, and a foreign object adhered to the probe card is removed from the probe card by the vibrating filaments and the gas blow.

According to a second aspect of the invention, there is provided a probe apparatus comprising: an inspecting section for inspecting therein the circuit of a substrate; a probe card located in the inspecting section and having a plurality of contact elements; a table located in the inspecting section for mounting thereon the circuit to be inspected; first movement means for moving the table between a position just below the probe card and a position remote from the probe card; a cleaning apparatus for cleaning the probe card; and second movement means for moving the cleaning apparatus between a position just below the probe card and a position remote from the probe card; wherein the table is moved by the first movement means to the position remote from the probe card, and the cleaning apparatus is moved by the second movement means to the position just below the probe card to clean the probe card.

According to a third aspect of the invention, there is provided a probe apparatus comprising: an inspecting section for inspecting therein the circuit of a substrate; a probe card located in the inspecting section and having a plurality of contact elements; a table located in the inspecting section for mounting thereon the circuit to be inspected; a container containing the probe card; a probe card transfer path located between the container and the inspecting section; and a cleaning apparatus provided in the probe card transfer path; wherein the cleaning apparatus cleans the probe card during transfer of the probe card along the transfer path.

According to a fourth aspect of the invention, there is provided a probe apparatus comprising: a plurality of inspecting sections for inspecting therein the circuits of substrates; a plurality of probe cards located in the inspecting sections, respectively, and each of the probe cards having a plurality of contact elements; a plurality of tables located in the respective inspecting sections for mounting thereon the circuits to be inspected; first movement means for moving each of the tables between a position just below a corresponding one of the probe cards and a position remote from the corresponding one of the probe cards; a cleaning apparatus for cleaning the probe cards; and second movement means for moving the cleaning apparatus between a position just below one of the probe cards and a position remote from the one of the probe cards; wherein one of the tables is moved by the first movement means to a position remote from a corresponding one of the probe cards, the cleaning apparatus is moved by the second movement means to a position just below the corresponding one of the probe cards to clean the corresponding one of the probe cards, and the cleaning apparatus is then moved by the second movement means to a position just below another probe card to clean the another probe card.

According to a fifth aspect of the invention, there is provided a probe apparatus comprising: an inspecting section for inspecting therein the circuit of a substrate; a probe card located in the inspecting section and having a plurality of contact elements; a table located in the inspecting section for mounting thereon the circuit to be inspected; a cleaning apparatus attached to the table; and movement means for moving the table and the cleaning apparatus between a position just below the probe card and a position remote from the probe card; wherein the movement means moves the table and the cleaning apparatus to the position remote from the probe card and to the position just below the probe card, respectively, to clean the probe card using the cleaning apparatus.

According to a sixth aspect of the invention, there is provided a method of cleaning a probe card having a contact element to be brought into electrical contact with a pad of a circuit to be inspected, comprising the steps of: bringing a multiple of conductive fiber elements into contact at least with the contact element of the probe card; moving the conductive fiber elements relative to the probe card; and removing a foreign material adhered from the probe card.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 3 is a plan view, showing a cleaning apparatus situated in a retreat position;

FIG. 4 is a plan view, showing the cleaning apparatus situated in a cleaning position;

FIG. 9 is a plan view, showing a cleaning apparatus with a handling arm according to a modification of the first embodiment;

FIG. 10 is a plan view, showing a cleaning apparatus with a handling arm according to another modification of the first embodiment;

FIGS. 11–13 are cross sectional views, showing the interior of a probe apparatus according to a second embodiment of the invention;

FIG. 15 is a plan view of a probe apparatus according to the third embodiment of the invention;

FIG. 16 is a sectional view, showing the interior of a probe apparatus according to a fourth embodiment of the invention;

FIG. 19 is a perspective view of a cleaning apparatus according to a fifth embodiment of the invention;

FIG. 20 is a side view of a cleaning section in the cleaning apparatus according to the fifth embodiment of the invention;

FIG. 21 is a cross sectional view of a probe card with inclined probes;

FIG. 22 is a cross sectional view of a probe card with a membrane type contact element;

FIG. 23 is a cross sectional view of a modification of the cleaning apparatus according to the fifth embodiment of the invention;

FIG. 25 is a cross sectional view, showing the interior of a probe apparatus according to a sixth embodiment of the invention;

FIG. 26 is a perspective view of an essential part of the probe apparatus according to the sixth embodiment of the invention;

FIGS. 27A and 27B are views, showing cleaning means;

FIG. 30 is a flowchart, useful in explaining a cleaning treatment;

FIGS. 31A–31E are views, useful in explaining the operation of the cleaning means;

DETAILED DESCRIPTION OF THE PREFERRED EMBODIMENTS

The preferred embodiments of the invention will be explained in detail with reference to the accompanying drawings.

Figure 1:
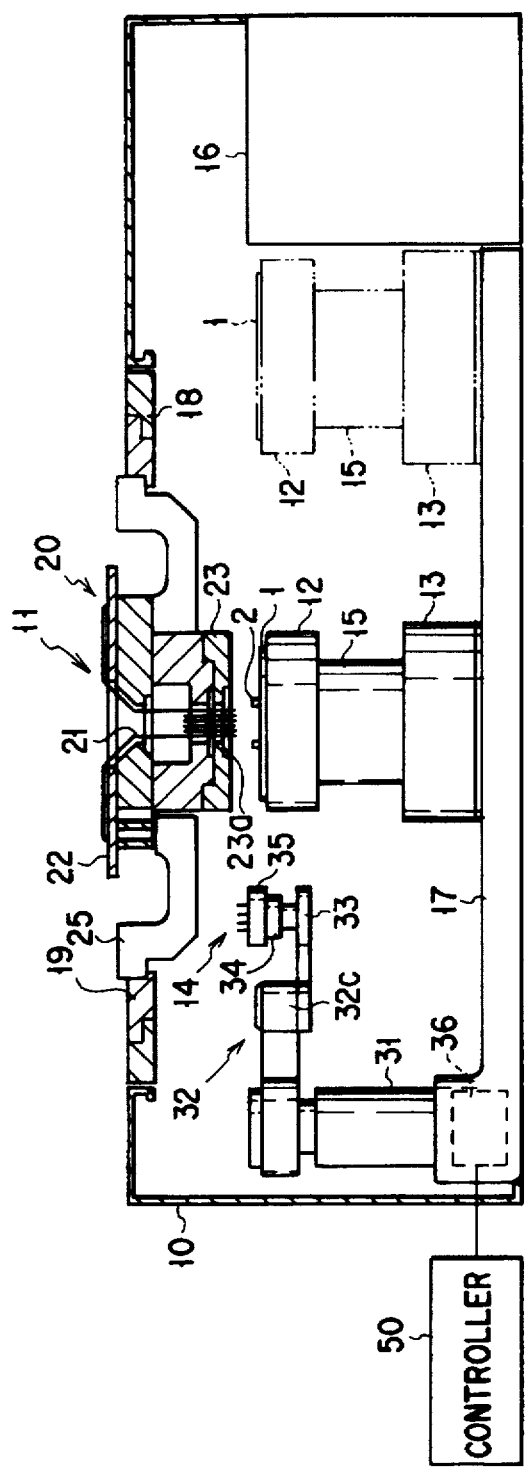
FIG. 1 is a cross sectional view, showing the interior of a probe apparatus (at the time of inspection) according to a first embodiment of the invention.

FIG. 1 is a cross sectional view of a wafer prober according to a first embodiment of the invention. This wafer prober comprises a box body 10; an inspecting section 11 in which the electric characteristics of a wafer 1 is measured by bringing probes 21 into contact with electrode pads 2 on the wafer 1; a wafer-mounting table 12 for mounting thereon the wafer 1 to be measured; an XY stage 13 for moving in the X-axis and Y-axis directions the table 12 and a transfer unit (not shown) for transferring the wafer 1 onto the table 12; and a cleaning apparatus 14 for removing dust adhered to probes 21 and to that surface of a probe card 20 which is opposed to the wafer 1.

The box body 10 of the wafer prober is provided on a base table 17, and the inspecting section 11 is provided with a head plate 18 parallel to the base table 17 and supported by the box body 10. The head plate 18 has a center opening formed therein, in which the probe card 20 supported by a holder 25 is fitted via an insert ring 19. The probe card 20 is of the vertical type in which the probes 21 are arranged perpendicular to the surface of the wafer 1. The probe card 20 incorporates the probes 21, a substrate 22 which supports the probes 21, and a guide section 23 which guides the probes 21 and has a guide member 23a. The wafer-mounting table 12 is placed on the XY stage 13 having the above-described X- and Y-directional movement mechanism. The XY stage 13 can move the table 12 between a mounting position near a loader 16 and the inspecting section 11.

A transfer unit (not shown) for transferring the wafer prober is known from Japanese Patent Application KOKOKU Publication No. 5-29143, Japanese Patent Application KOKAI Publication No. 62-169341, etc. Therefore, only its outline will be explained.

The wafer 1 is taken out of a wafer cassette (not shown), in a position indicated by the two-dot-chain line, by means of a handling arm (not shown) provided on the right side of the base table 17 of the wafer prober, thereby placing the wafer 1 onto the wafer-mounting table 12. The table 12 with the wafer 1 is transferred to the inspecting section 11 by moving the XY stage 13.

In the inspecting section 11, the probes 21 are aligned with the electrode pads 2, and then brought into contact with them by moving upward the table 12 by a vertical movement device 15. The semiconductor chips on the wafer 1 are sequentially probed. After a predetermined number of times of probing, the probes 21 and that surface of the probe card 20 which is opposed to the wafer 1 are automatically cleaned by means of a cleaning apparatus 14. After the cleaning, the probing operation is restarted. For example, cleaning is automatically executed every 40000 times of probing.

Figure 2:
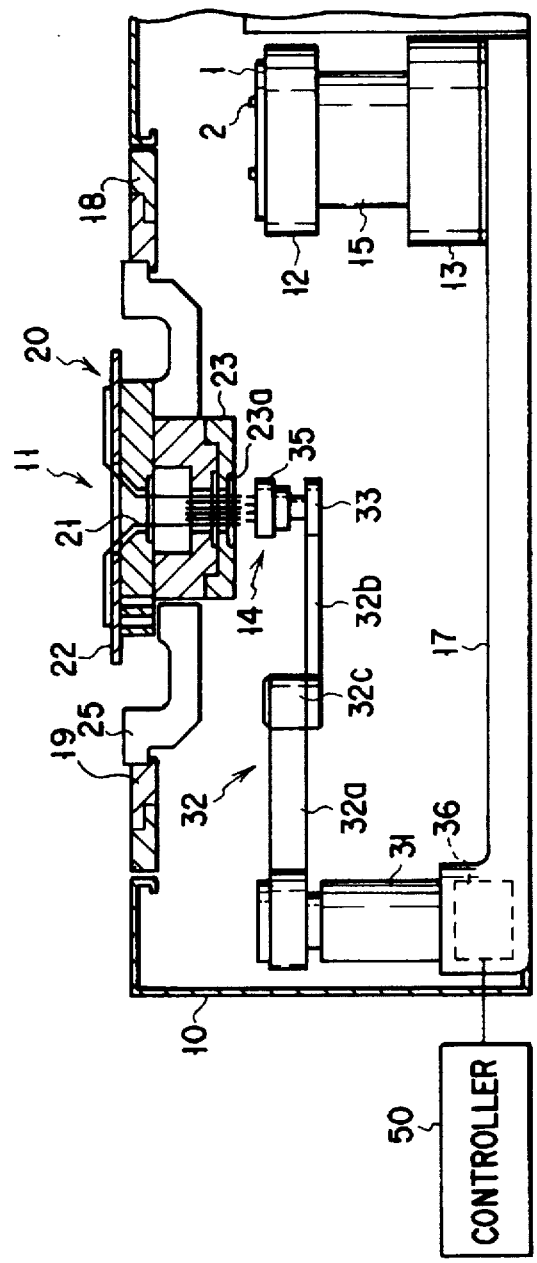
FIG. 2 is a cross sectional view, showing the interior of the probe apparatus (at the time of cleaning) according to the first embodiment of the invention.

As is shown in FIG. 2, the table 12 is retreated at the time of cleaning from the inspecting section 11 by means of the XY stage. Then, a handling arm 32 located on the left side of the base table 17 is driven by an arm driving unit 36 to move the cleaning apparatus 14 to a position just below the probes 21 of the probe card 20. After the probes 21 and the surface of the probe card 20 which is opposed to the wafer 1 are cleaned by the cleaning apparatus 14, the cleaning apparatus 14 is returned to its original position, and probing is restarted.

A controller 50 is connected to the arm driving unit 36 of the handling arm 32. On the basis of a control signal from the controller 50, the cleaning apparatus 14 is moved to the position just below the probes 21 by means of the handling arm 32. The cleaning apparatus 14 has a brush unit 35. When the cleaning apparatus 14 has been vertically moved by the vertical movement device 33, the tip portion of the brush unit 35 is brought into contact with the probes, thereby cleaning them.

The driving unit for driving the cleaning apparatus 14 will now be explained in detail.

As is shown in FIG. 2, a column 31 stands on the base table 17, and an end of the handling arm 32 is rotatably connected to the column 31. The handling arm 32 is a double-shaft arm which comprises a main arm 32a and a sub arm 32b. These arms 32a and 32b are rotatably coupled with each other by means of a joint 32c. The column 31 contains an arm driving unit 36 consisting of a pulse motor. That shaft of the pulse motor which projects from the upper end of the column 31 is coupled with an end of the main arm 32a, and also with an end of the sub arm 32b via a gear and a belt. Thus, the main and sub arms 32a and 32b are rotated when a control signal has been output from the controller 50.

The vertical movement device 33 connected to the cleaning apparatus 14 is provided on the free end of the sub arm 32b.

The cleaning apparatus 14 is moved by means of the arm 32 driven by the driving unit 36 from a retreat position in the vicinity of the column 31 as shown in FIG. 3, to a position just below the probe card 20 in the inspecting section 11 as shown in FIG. 4.

An air jetting port 59 and a suction port 60 are provided on the opposite sides of the measurement section 11 for removing dust which is generated during cleaning. These ports 59 and 60 are connected to an air source and a suction unit (not shown), respectively.

The structure of the cleaning apparatus 14 will be explained in detail.

Figure 5:
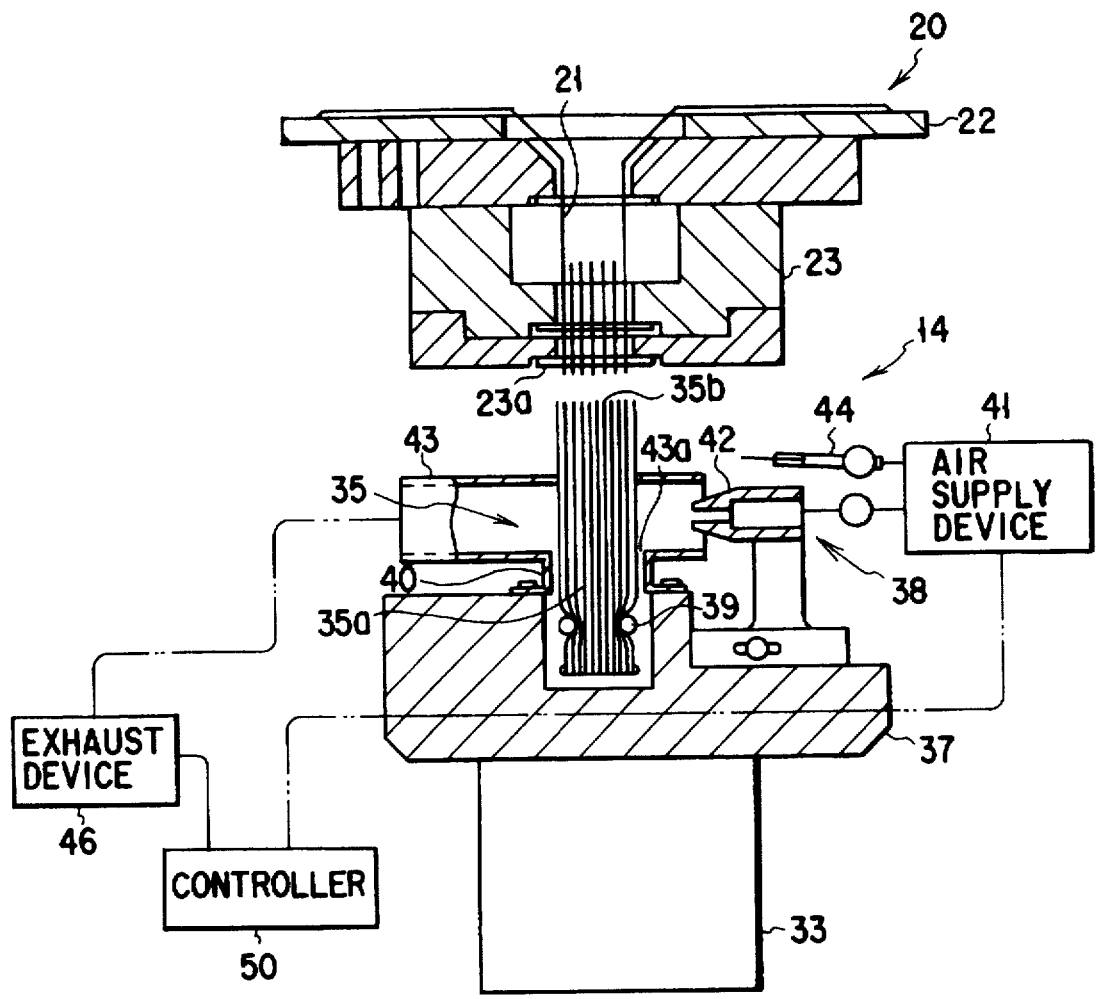
FIG. 5 is a cross sectional view, showing the cleaning apparatus in detail.

As is shown in FIG. 5, the cleaning apparatus 14 has a base unit 37, the brush unit 35 and a vibrator 38 for vibrating (swinging) the brush unit 35.

The base unit 37 is placed on the vertical movement device 33 which is mounted on the free end of the handling arm 32. The brush unit 35 is provided at the base unit 37, and has a filament bundle 35a arranged coaxial with the probes 21. The proximal end of the filament bundle 35a is fixed by a fixing metal member 39.

The filament bundle 35a is formed by bundling folded synthetic fiber members made of e.g. a nylon-based fiber, and has a rectangular cross section. For example, each fiber member has a length of 35 mm, and the filament bundle 35a has a rectangular cross section of 6×4 mm. The bundle 35a has its free end 35b opposed to the tip of the probes 21 and its proximal end fixed by the fixing metal member 39. A guide member 40 is secured to the cleaning base unit 37 and guides the free end 35b such that it is aligned with the probes 21. The guide member 40 is formed of an aluminum member which has a rectangular cross section, a thickness of 0.5 mm, and a size of 8 mm (length)×6 mm (width). The position of the free end 35b of the filament bundle 35a, which is assumed at the time of bringing the bundle 35a into contact with the probes 21, is determined by controlling the arm 32.

Where the filaments of the filament bundle 35a are made of a synthetic fiber, static electricity may be generated when they have contacted the guide member 23a. If the probes 21 are charged with electricity at the time of contacting the filament bundle 35a, the electricity will be discharged when the probes 21 have been brought into contact with a circuit to be inspected, with the result that the circuit will be dielectrically broken down at worst. To avoid this, it is desirable to form the filaments of a conductive material such as carbon fiber, graphite fiber, boron fiber, SiC whisker or alumina whisker. Alternatively, the filaments may be formed of a synthetic fiber which contains conductive particles, such as acrylic fiber with copper sulfide particles dispersed therein. Such a particle-dispersed fiber is formed by mixing an appropriate amount of conductive particles into a synthetic fiber in a softened state, and extruding the mixture through a small hole.

The vibrator 38 has an air supply device 41, an air gun 42 for intermittently applying air blow onto the brush unit 35, and a hollow member 43 serving as an air passage. Air adjusted by the air supply mechanism 41 and intermittently applied by the air gun 42 passes through the hollow member 43. The hollow member 43 extends in a direction perpendicular to the longitudinal direction of the probes 21, and is fixed to the guide member 40. A rectangular opening 43a is formed in a longitudinal center portion of the hollow member 43, and loosely guides therethrough the filament bundle 35a of the brush unit 35 such that the free end 35b of the filament bundle 35a can be vibrated (swung) by air. In other words, the opening 43a has a "swing allowance".

An exhaust device 46 is provided on the opposite side of the air gun 42. The air supply device and the exhaust device 46 are controlled by a controller 50.

Figure 6:
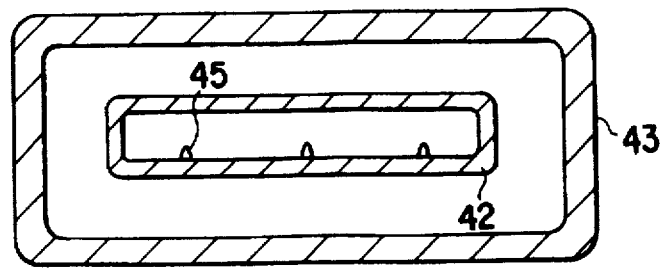
FIG. 6 is a transverse sectional view of an air gun incorporated in the cleaning apparatus.

Since the air gun 24 has a rectangular cross section as shown in FIG. 6, a turbulent flow will occur at a junction between a piping of a circular cross section and the air gun 42. To transform the turbulent flow into a substantially regular flow, a plurality of flow adjusting blades 45 are provided on the inner bottom wall of the air gun 42. However, the flow adjusting blades are not indispensable components. Further, as is shown in FIG. 5, an air nozzle 44 which serves as an air application system different from the air gun 42 is connected to the air supply device 44. The air nozzle 44 has an adjuster for adjusting the direction of air jet so that air can be applied to the tip portions of the probes 21.

Figure 7:
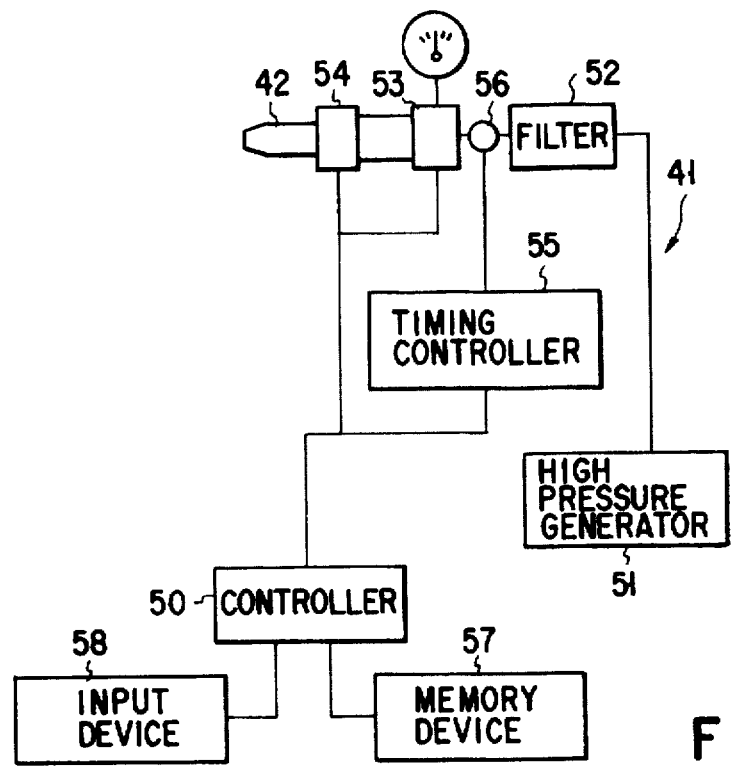
FIG. 7 is a block diagram, showing an air supply mechanism incorporated in the cleaning apparatus.

As is shown in FIG. 7, the air supply device 41 has a high pressure generator 51, an air filter 52 (with a thickness of about 0.5 micron and, if necessary, with an air dryer), a pressure adjuster 53 (which receives an input of 3–10 kg and generates an output of 0–3 kg or 0–0.5 kg), a flow adjuster 54 (which consists, for example, of a needle valve), and a timing controller 55 (which consists, for example, of a solenoid valve with an opening cycle which can be varied within a range of 0.2–2 seconds, and with a duty ratio which can be varied within a range of 20–80%). When a pulse has been input to the timing controller 55, the controller 55 drives an electromagnetic valve 56, thereby intermittently supplying air to the air gun 42. As a result, the air gun 42 intermittently applies air to the brush unit 35.

The pressure adjuster 53, the flow adjuster 54 and the timing controller 55 are connected to the controller 50, and controlled by the same. Predetermined control menus can be set in the controller 50 by programs preset in a memory device 57 or by an input from an input device 58 such as a keyboard. Moreover, upon receiving an instruction to perform cleaning, the controller 50 determines whether or not the table 12 is situated in the inspecting section 11. If the table 12 is not in the inspecting section 11, the controller 50 drives the handling arm to move the cleaning base unit 37 to the inspecting section 11, and drives the vertical movement device 33 to move upward the cleaning base unit 37 until the filament bundle 35a of the brush unit 35 contacts the probes 21. The controller 50 further adjusts the flow/pressure of air, the vibration of the brush unit, etc. to respective appropriate values.

The operations of the probe apparatus and the cleaning apparatus will now be explained.

First, the wafer 1 is taken out of a wafer cassette (not shown), and rough positioning of the wafer is performed. Then, as is shown in FIG. 1, the wafer 1 is placed on the table 12, and the table 12 with the wafer 1 is moved to the inspecting section 11 by means of the XY stage 13. Subsequently, the electrode pads 11 on the chips of the wafer 1 are aligned with the probes 21 of the vertical type probe card 20 located in an upper portion of the inspecting section 11. The table 11 with the wafer 1 is further raised to bring the electrode pads of the chips into contact with the probes 21. The table 11 is further driven to enable a probing operation to be performed repeatedly, thereby inspecting the electric circuit of each chip.

If it is programmed that the cleaning is performed under predetermined conditions, for example, after 40,000 times of probing, the handling arm 32 retreated in a predetermined position is moved by the controller 50 to displace the cleaning apparatus 14 to the inspecting section 11.

Figure 8:
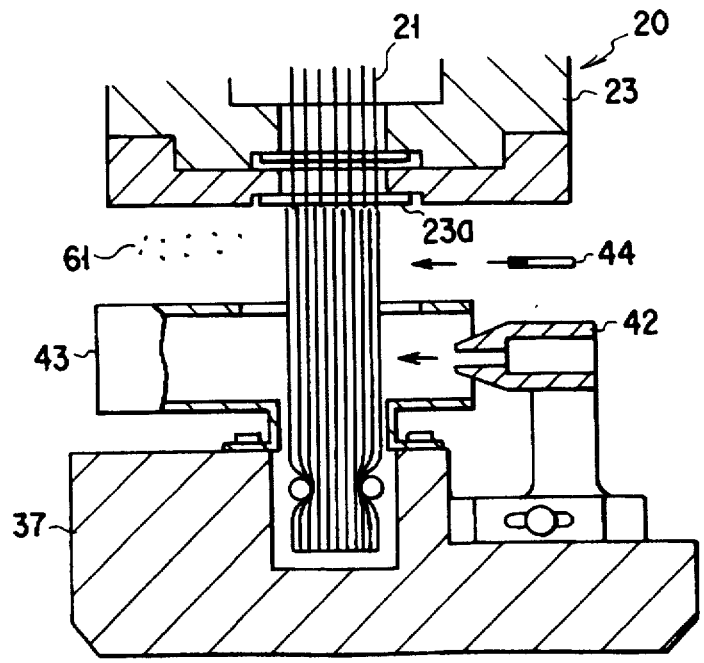
FIG. 8 is a partially expanded sectional view, useful in explaining the cleaning apparatus.

As is shown in FIG. 2, the cleaning apparatus 14 in the inspecting section 11 is raised by the vertical movement device 33, and stopped when the tip end of the brush unit 35 has contacted the guide plate 23a of the probe card 20. With the cleaning apparatus 14 kept in this position, air is intermittently applied to the brush unit 35 from the air gun 42 to vibrate the brush unit, as is shown in FIG. 8. By vibrating the tip end 35b of the brush unit 35, a foreign object adhered to the guide plate 23a is physically removed and rises as particles 61. At the same time, a foreign object adhered to the probes 21 is physically removed during vibration and rises as dust 61.

The particles 61 is blown off by highly pressurized air from the air nozzle 44. After the blow operation is performed 1–2 minutes, the materials adhered to the guide member 23a of the probe card 20 and the robes 21 are sufficiently removed therefrom. The period of the blow operation is preset by the controller 50.

Although in the embodiment, highly pressurized air from the air nozzle 44 is used to blow off the particles 61, the particles 61 may be blown off by the air from the nozzle 42. Further, the dust 61 may be blown off, using both the nozzles 42 and 44.

After cleaning the probe card, the cleaning apparatus 14 is moved down to the original position by the vertical movement device 33. Thereafter, the table 12 is returned to the measurement position to probe another wafer.

The removal of conductive materials deposited in spaces defined between probes can prevent short-circuiting, etc. due to the materials, which contributes to extension of the service life of the probe card. By virtue of the cleaning apparatus 14, the number of times of probing which can be performed at maximum by the vertical probe card 20 according to the first embodiment is 3–6 times of the maximum probing times (i.e. about 40,000 times) which can be performed by the conventional probe card with no cleaning apparatus. This extension of life of the probe card significantly reduces the number of times of exchange of probe cards, and accordingly the time required to maintenance. As a result, the efficiency of production of semiconductor devices is greatly increased.

Furthermore, in general, where a probe card is broken during manufacturing a semiconductor device, a great amount of time is required not only to exchange probe cards, but also to align electrode pads 2 with the probes of a new probe card. Such a time can be saved by using the probe card of the present invention.

In addition, since in the above-described vertical type probe card, the brush unit 35 is situated coaxial with the probes 21 which are arranged with fine spaces interposed therebetween, the filaments of the brush unit 35 cannot easily be entangled with the probes 21, enabling efficient cleaning.

Moreover, since in the first embodiment, the cleaning apparatus is moved from a retreat position to an inspecting section in which the probe card 20 is situated, to clean the guide plate 23a of the probe card 20 and the probes 21, the time required, in the conventional case, to detach the probe card from a head plate at the time of cleaning is not necessary and accordingly the workability is enhanced.

A case where a parallel movement apparatus 62 which has its opposite ends fixed is used in place of the handling arm 32 will be explained. In this case, the elements other than the parallel movement apparatus 62 are constructed as in the first embodiment.

As is shown in FIG. 9, the parallel movable apparatus 62 comprises a pair of guide rails 63 arranged below the head plate 18 and parallel to each other on the opposite sides of the inspecting section 11, and an H-shaped member 64 movable along the guide rails 63 in a direction indicated by arrow X. The above-described vertical movement device 33 is provided at a center portion of the movable member 64, and the cleaning base unit 37 is mounted on the vertical movement device 33. The parallel movable apparatus 62 retreated in a predetermined position (on the left in FIG. 9) is moved to the inspecting section 11 such that the center of the cleaning apparatus 14 is aligned with the center of the section 11 as shown in FIG. 10. The cleaning apparatus 14 is then moved up by the vertical movement device 33 until the brush unit 35 contacts the probes 21, thereby performing cleaning in the same manner as explained above.

A second embodiment of the invention will now be explained.

In this embodiment, the cleaning apparatus of the invention is applied to a wafer prober wherein probe cards are automatically exchanged with each other.

As is shown in FIG. 11, the wafer prober is provided with a cassette 65 which contains a plurality of probe cards 20 compatible with various types of semiconductor devices. An appropriate one of the contained probe cards 20 is taken out of the cassette 65 by a probe card transfer unit 66, and mounted on the head plate 18 in the inspecting section 11 to inspect the wafer 1. The probe card transfer unit 66 has a transfer arm (not shown). The essential part of the prober of the second embodiment is similar to that of the prober of the first embodiment, and comprises the box body 10, the inspecting section 11, the wafer transfer unit (not shown) and the cleaning apparatus 14.

The head plate 18 supported by the box body 10 is provided in the inspecting section 11. The vertical type probe card 20 supported by the holder 25 is fitted in an opening 18a formed in a center portion of the head plate 18 with the insert ring 19 interposed therebetween.

Each of the vertical type probe card 20 is vertically movably contained in the cassette 65, with that end of the probe 21, which is to be brought into contact with the wafer 1, directed downward.

The cleaning apparatus 14 is mounted on a column 67, with a vertical movement device 68 interposed therebetween for vertically moving the cleaning apparatus 14. The column 67 is located in the transfer path of the probe card between the inspecting section 11 and the cassette 65.

The probe card transfer unit 66 transfers an appropriate one of the probe cards 20 from the cassette 65 to the box body 10 through a shutter 69 in the open state, and then moves the probe card to the inspecting section 11. When the probe card has reached the inspecting section 11, the unit 66 raises the probe card to the opening 18a of the heat plate 18, where the holder 25 is engaged with the insert ring 19 by means of an engaging device (not shown).

The operation of the second embodiment will be explained.

Figure 13:
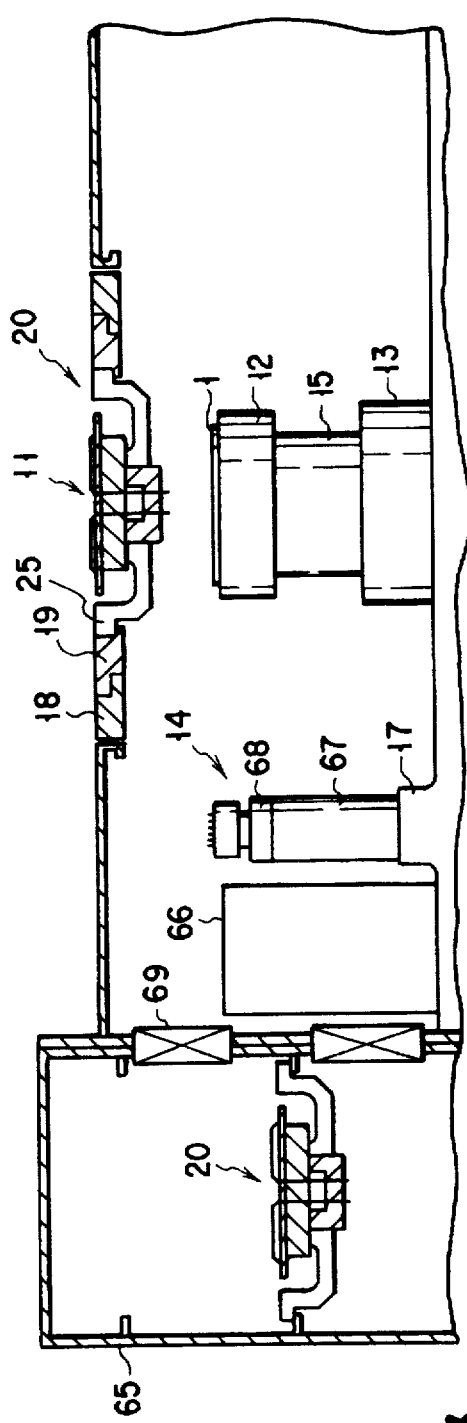

That one of the probe cards 20 which is suitable to the wafer 1 is taken out of the cassette 65 and transferred to the box body 10 by the probe card transfer unit 66. On the way to the head plate 18 in the inspecting section 11, the probe card is stopped in a cleaning position above the cleaning apparatus 14 as shown in FIG. 12, where the cleaning apparatus 14 is moved up by the vertical movement device 68 until the tip of the brush unit 35 contacts the guide plate 23a of the probe card 20. In this state, the probe card 20 is cleaned by the cleaning apparatus 14 in the same manner as in the first embodiment. After the cleaning, the probe card 20 is fitted in the opening 18a of the head plate 18 as shown in FIG. 13. When the probe card 20 has been mounted, the inspection of the wafer 1 is started.

In the second embodiment, the guide plate 23a and probes 21 of the probe card 20 are cleaned by the cleaning apparatus 14 in the transfer path between the cassette 65 and the head plate 18, and then situated in the inspecting section 11. Thus, the probe card 20 is always clean when probing is started, which enables stable probing and accordingly enhances the working efficiency.

A prober according to a third embodiment of the invention will be explained.

Figure 14:
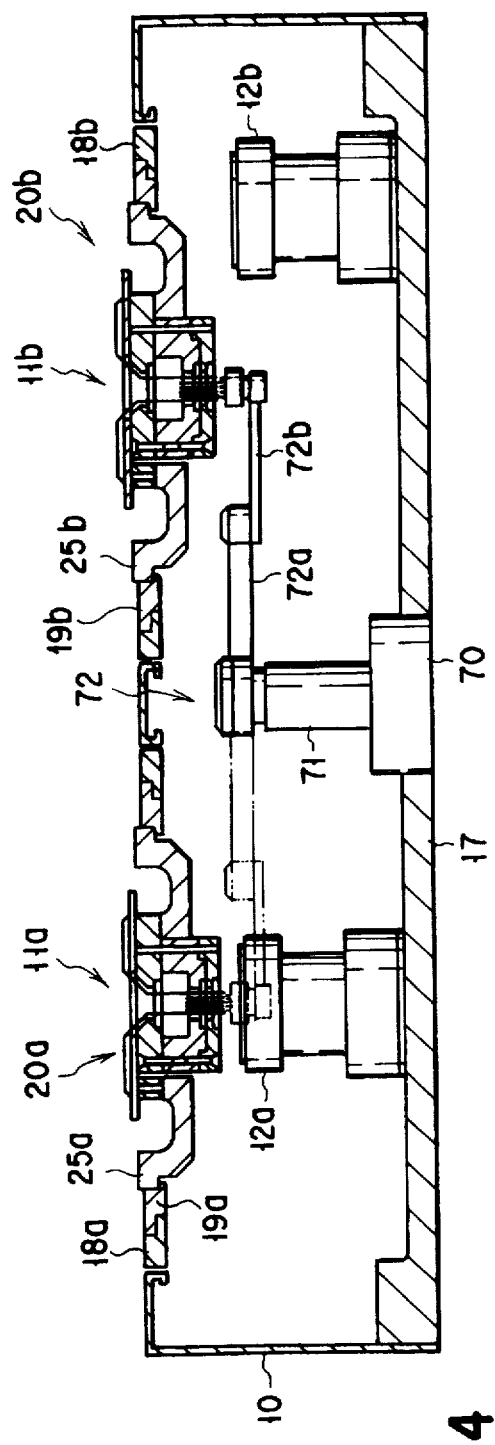
FIG. 14 is a sectional view, showing the interior of a probe apparatus according to a third embodiment of the invention.

As is shown in FIGS. 14 and 15, the prober of the third embodiment has two inspecting sections 11a and 11b, and a handling mechanism for guiding the cleaning apparatus 14 to probe cards 20a and 20b on wafer-mounting tables 12a and 12b located in the inspecting sections 11a and 11b, respectively. In other words, this prober can clean a plurality of probe cards using the single cleaning apparatus 14.

The handling mechanism comprises a transfer unit 70 provided between the inspecting sections 11a and 11b. The transfer unit 70 functions as means for transferring wafers 1 on the tables 12a and 12b (the wafer-transfer arm of the unit 70 is not shown), and also as means for transferring the cleaning apparatus 14 to the vertical type probe card 20a or 20b. As the means for transferring the cleaning apparatus 14, the transfer unit 70 has a handling arm 72 supported by a column 71. The handling arm 72 moves the cleaning apparatus 14 to the vertical type probe cards 20a and 20b. Like the handling arm 32, the handling arm 72 is a double-shaft arm which comprises a main arm 72a and a sub arm 72b. The handling arm 72 is rotatable about the column 71 to move the cleaning apparatus 14 to a center portion of each of the probe cards 20a and 20b.

In the third embodiment, the cleaning apparatus 14 mounted on the handling arm 72 is responsive to an instruction from the controller 50 for cleaning that one of the probe cards 20a and 20b which should be cleaned.

Since in the third embodiment, a plurality of probe cards can be cleaned using the single handling arm 72, the wafer prober with a plurality of inspection stages can be made compact and light.

A prober according to a fourth embodiment of the invention will be explained.

Figure 17:
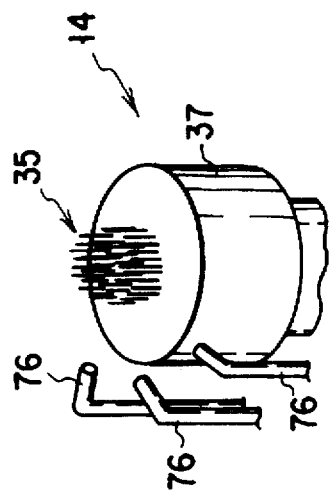
FIG. 17 is a perspective view of the probe apparatus according to the fourth embodiment of the invention.

As is shown in FIG. 16, in the prober of the fourth embodiment, the cleaning apparatus 14 is attached to the wafer-mounting table 12 via an attachment member 75 and the vertical movement device 33. Specifically, the attachment member 75 which extends outward is secured to a lower portion of the table 12, the vertical movement device 33 is mounted on an outward end portion of the attachment member 75, and the cleaning apparatus 14 is mounted on the vertical movement device 33. Air is supplied from a nozzle 76 to the cleaning apparatus 14. The nozzle 76 may have a single air jet port or double or more air jet ports. Alternatively, as is shown in FIG. 17, a plurality of nozzles 76 may be opposed to the brush unit 35 of the cleaning apparatus 14.

Figure 18:
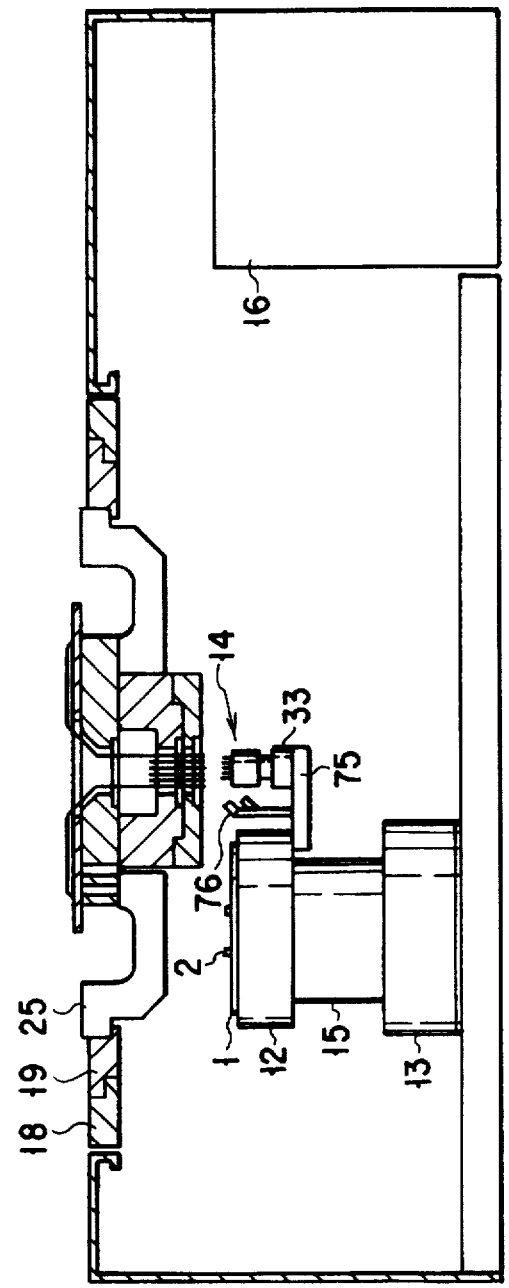
FIG. 18 is a sectional view, showing the interior of the probe apparatus (at the time of cleaning) according to the fourth embodiment of the invention.
Figure 24:
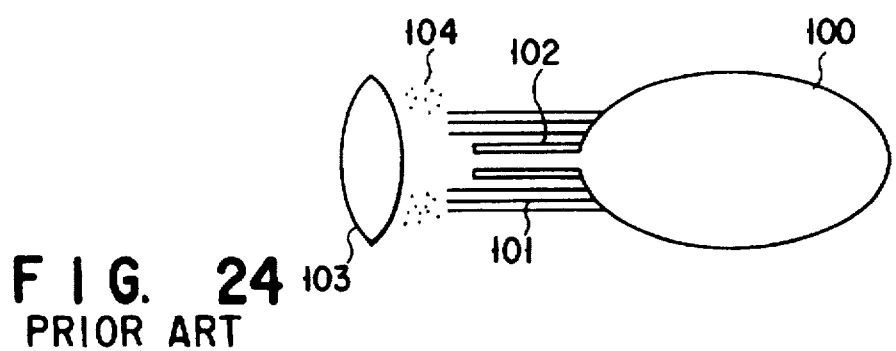
FIG. 24 is a view, showing a conventional cleaning brush used as a lens cleaner.

As in the first embodiment, in the prober of the fourth embodiment, the cleaning apparatus 14 is situated, after probing the wafer 1, just below the center of the probe card 20 by transferring the table 12 together with the XY stage 13 as shown in FIG. 18. Thereafter, the cleaning apparatus 14 is raised by the vertical movement device 33 to bring the tip of the brush unit 35 into contact with the guide plate 23a. Thus, the guide plate 23a and the probes 21 are cleaned in the same manner as described above.

Thus, attaching the cleaning apparatus to the wafer-mounting table 12 can omit the handling device of the cleaning apparatus, and hence simplify the structure of the apparatus. Further, since it suffices if the wafer-mounting table 12 is slightly displaced to clean the probe card, cleaning can be performed with extreme efficiency.

A fifth embodiment of the invention will be explained.

The fifth embodiment employs a cleaning apparatus 77 separate from the prober. As is shown in FIG. 19, the cleaning apparatus 77 comprises a probe card-mounting table 78 on which the probe card 20 is mounted with the probes 21 directed upward, a cleaning section 79 movably supported by the table 78, and a movement device 80 for moving the cleaning section 79 in the X-, Y-, and Z-directions. As is shown in FIG. 20, the cleaning apparatus 77 has an air pipe 81, a linear brush unit 82 having filaments, a nozzle 83 for jetting air in a direction perpendicular or oblique to the axis of the brush unit, and a manual valve 84 for controlling the air jet. Since the mechanism employed in this embodiment for intermittently jetting air is the same as that employed in the first embodiment, its explanation is omitted. Moreover, a microscope 85 is provided at an appropriate location for monitoring the state of cleaning.

The cleaning apparatus constructed as above can efficiently clean a probe card detached from a prober.

The invention is not limited to the above-described embodiments, but can be modified in various manners without departing the scope of the invention.

For example, although in the embodiments, the invention is applied to the vertical type probe card, it is also applicable to an inclination type probe card as shown in FIG. 21, and to a membrane type probe card as shown in FIG. 22.

An inclination type probe card 88 as shown in FIG. 21 comprises a substrate 89 and probes 90 inclined relative to the substrate 89.

A membrane type probe card 91 as shown in FIG. 22 comprises a substrate 92, a block 93 provided on the lower surface of the substrate 92, a flexible membrane substrate 94 covering the block 93, bump type probes 95 provided on the lower surface of the membrane substrate 94, and a shock absorbing member 96 embedded in the lower surface of the block 93.

Where the invention is applied to the inclination type or the membrane type probe card, a sufficient cleaning effect can be obtained even if the invention employs only the brush mechanism and no air supply device. In this case, the cleaning apparatus basically comprises the base unit 37 and the brush unit 35 with the filament bundle 35a as shown in FIG. 23. It is a matter of course that to form the filament bundle 35a of a conductive material is effective to prevent generation of static electricity.

Further, although in the above embodiments, air is supplied to intermittently vibrate the brush, any other gas may be used instead of air.

Referring then to FIGS. 25–33, a sixth embodiment of the invention will be explained. In this embodiment, elements similar to those employed in the above-described embodiments will not be explained.

A cleaning mechanism 207 according to the sixth embodiment is attached to the wafer-mounting table 12 via an arm 206. The table 12 is movably placed on a stage 208. The stage 208 contains a movement device (not shown) to be controlled by a controller 215. The movement device moves the table 12 with the cleaning mechanism 207 in the XY plane.

As is shown in FIGS. 27A and 27B, the cleaning mechanism 207 has a brush unit 205 which consists of a multiple of filaments 216. The brush unit 205 is supported by a member 225 incorporated in a vertical movement device 224, and received in a center space 217 defined in a guide unit 221. Since the brush unit 205 is received in the center space 217 of the guide unit 221, dust can effectively be prevented from scattering from the filaments 216 when cleaning is not performed.

The space 217 communicates with the exhaust port of an exhaust device 222.

Figure 28:
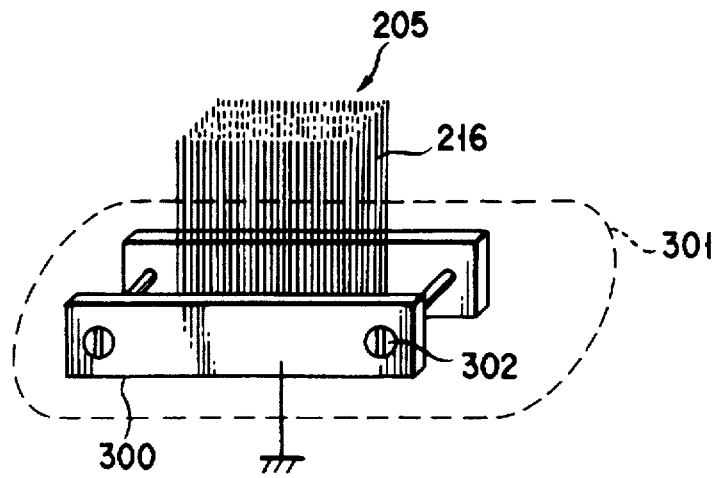
FIG. 28 is an exploded perspective view, showing a brush portion.

Referring then to FIG. 28, the fastening section 301 of the brush unit 205 will be explained. The brush unit 205 has its proximal end fastened by a pair of plates 300 with bolts 302 such that the bundle of the filaments 216 has a rectangular cross section. The plates 300 are grounded.

The filaments 216 are made of a conductive material such as carbon fiber, graphite fiber, boron fiber, SiC whisker or alumina whisker, and has such an elasticity as prevents plastic deformation. It is desirable to set the diameter of each filament 216 smaller than that of a tip portion of a probe 203, i.e. to set it to 20 µm or less.

Referring to FIGS. 30 and 31A–31E, the manner of cleaning the probe will be explained.

The probes 203 are brought into contact with the electrode pads of a semiconductor element, and a test signal is supplied to the pads to inspect the electric characteristics of the element (step S201). In the inspection using probes, either the pads or the probes 203 (or both of them) are moved horizontally to scrape the surface oxide film of the pads by the tip ends of the probes 203. As a result, the material of the oxide film and/or metal particles are adhered to the tip ends of the probes 203. The number of occasions of cleaning is counted. If the count value exceeds a predetermined value, the probes 203 are cleaned by the cleaning mechanism 207 (step S202) to remove, from the probe card, metal and oxide particles, fiber particles, protein particles, etc.

As is shown in FIG. 31A, the table 12 is moved down from the inspection position by the vertical movement device 14. Then, the cleaning mechanism 207 is horizontally moved by the XY stage 13 such that the center of the cleaning apparatus 14 is positioned just below the probes 203 as shown in FIG. 31B. Since a probe section 210 is fixed in a predetermined position, only the cleaning mechanism 207 is moved to align the brush unit 205 with the probes 203.

As is shown in FIG. 31C, the cleaning mechanism 207 is raised and temporarily stopped in a position in which the tip ends 216a of the filaments 216 are separated by about 5 mm from the tip ends of the probes 203. The exhaust device 222 is driven to exhaust the spaces between the filaments 216 of the brush unit 205. The operation of the exhaust device 222 may be started at any time before the filaments 216 contact the probes 203.

Figure 31D:
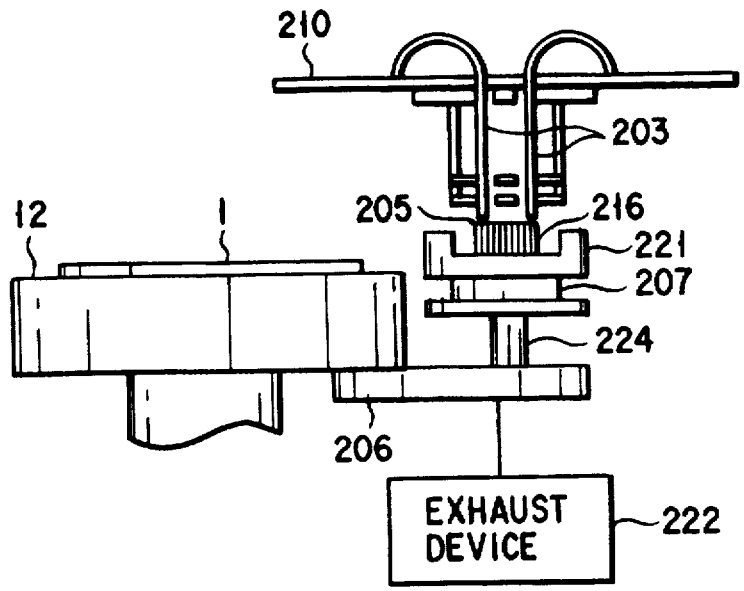
Figure 31E:
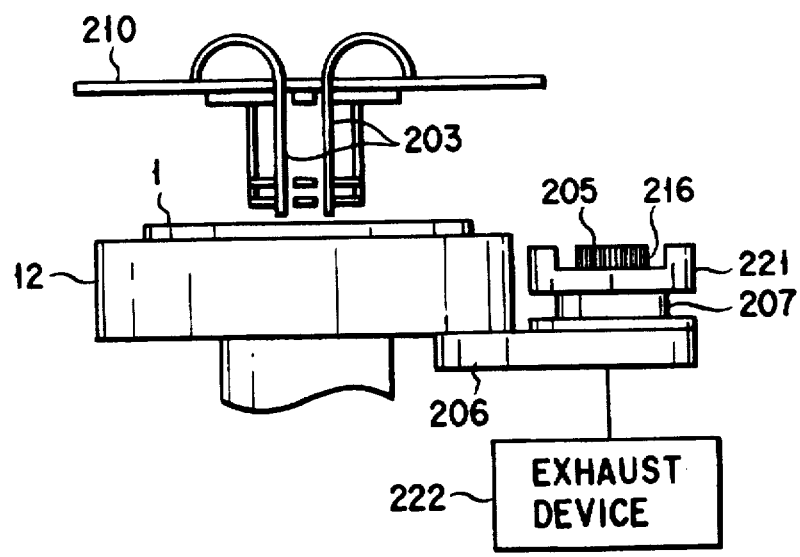
Figure 32:
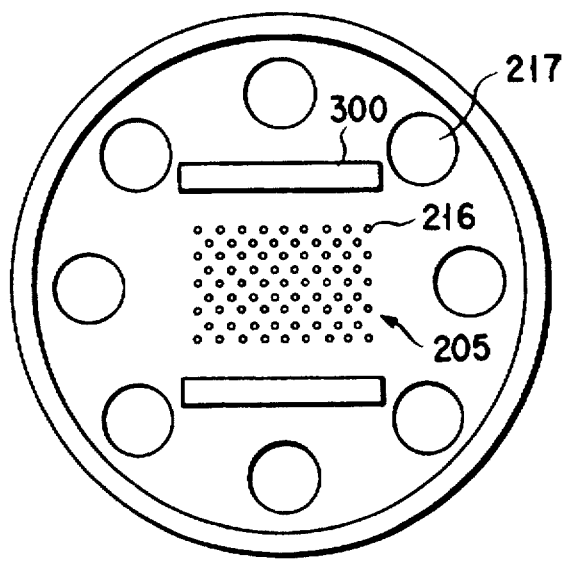
FIG. 32 is a plan view, showing a modification of the cleaning means.
Figure 33:
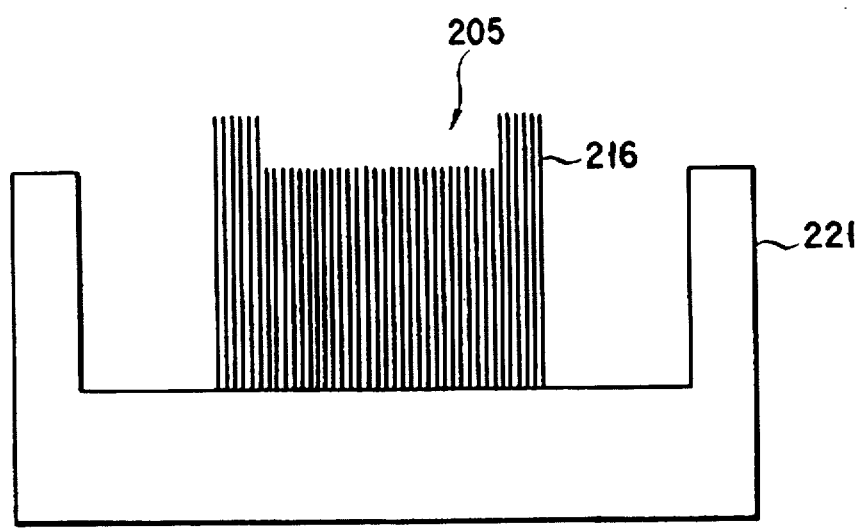
FIG. 33 is a cross sectional view of the modification of FIG. 32.

Subsequently, as is shown in FIG. 31D, the brush unit 205 is further raised by the vertical movement device 224, and stopped when the filaments 216 have contacted the probes 203. The brush unit 205 is moved up and down with the filaments 216 kept contact with the probes 203, thereby removing particles, etc. adhered to the probes 203 (step S203). At this time, the brush unit 205 may be moved only in the vertical direction (i.e. the Z-direction). However, it is preferable to move the brush unit 205 in both the vertical direction and horizontal direction (i.e. the X- and Y-directions), or to move the brush unit 205 in the Z-direction and at the same time to rotate about the Z-axis.

Figures 29A, 29B, 29C:
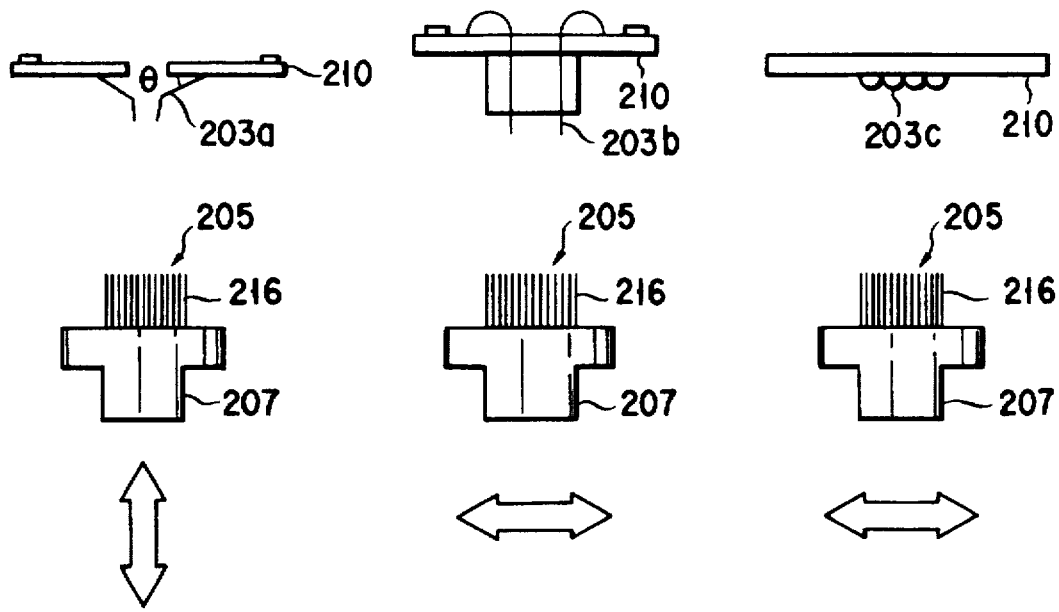
FIGS. 29A–29C are views, showing the relationship between the brush portion and probe cards of different types.

FIGS. 29A, 29B and 29C show various types of probes 203. The efficiency of cleaning can be enhanced by changing the movement of the brush unit 205 depending upon the types of the probes. For example, in the case of a general probe card with inclined probes 203a as shown in FIG. 29A, the brush unit 205 is reciprocated in the Z-direction. This is because the probes 203a have long vertical end portions.

On the other hand, the brush unit 205 is reciprocated in the XY plane both in the case of a vertical type probe card (VTPC) with vertical probes 203b as shown in FIG. 29B, and in the case of a membrane type probe card with contacts 203c as shown in FIG. 29C. This is because the probes 203b and 203c have short vertical end portions.

In the case of employing the reciprocating operation in the XY plane, it is preferable to set the stroke of the brush unit 205 much larger than the size of the semiconductor chip. If the semiconductor chip has a size of (10 mm×10 mm), it is preferable to set the stroke to 50–70 mm.

Particles, which have scattered as a result of the mechanical contact of the brush unit and the probes 203a or 203b (or the contacts 203c), are sucked by the exhaust device 222 and discharged from the clean room. Since the brush unit 205 is grounded via the fastening plates 300, no static electricity is accumulated on the filaments of the brush unit 205. Until the controller 215 receives a signal indicative of the termination of cleaning, the cleaning treatment is repeated (steps S203 and S204).

After the cleaning treatment, the brush unit 205 is moved down and received in the guide unit 221, and then the overall cleaning mechanism 207 is moved down to a position below the upper surface of the wafer-mounting table 12 (step S204). The cleaning mechanism 207 is returned to its home position, and the table 12 is moved to a position just below the inspection unit 210 to perform the next inspection.

Since in the above-described embodiments, the probe card is prevented from being charged with electricity as a result of the brush cleaning, the circuits of semiconductor chips inspected in the next inspection are protected from dielectric breakdown when the probes 203 have been brought into contact with the pads 2 of the semiconductor chips.

Further, since in the embodiments, the manner of vibration of the brush is changed depending upon the type of the probe card so as not to apply an excessive force to the probes 203a, 203b or the contacts 203c, breakage or deformation of the probes and contacts can be prevented. Accordingly, the probe card can have a longer service life and hence be used for a longer period than in the conventional case. As a result, the working ratio of the cleaning apparatus can be significantly enhanced.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A cleaning apparatus for cleaning at least one contact element of a probe card, said cleaning apparatus comprising:

a brush unit having a plurality of conductive fiber filaments for contacting and cleaning the at least one contact element of the probe card; and a gas supplying mechanism with at least a gas outlet intermittently supplying a flow of gas onto and through the plurality of conductive fiber filaments of the brush unit to vibrate the conductive fiber filaments such that foreign objects adhered to the at least one contact element of the probe card are cleaned away at least by the vibrating filaments.

2. The cleaning apparatus according to claim 1, wherein the conductive fiber filaments of the brush unit are arranged such that the conductive fiber filaments are aligned with the at least one contact element in a longitudinal direction of the at least one contact element when the at least on contact element is in contact with the brush unit.

3. The cleaning apparatus according to claim 1, wherein the conductive fiber filaments each have a diameter equal to or smaller than the diameter of the at least one contact element.

4. The cleaning apparatus according to claim 1, wherein the conductive fiber filaments of the brush unit remove static electricity from the probe card when said conductive fiber filaments contact any portion of the probe card.

5. The cleaning apparatus according to claim 1, further comprising means for causing any of the foreign objects detached from the probe card to be removed during cleaning.

6. The cleaning apparatus according to claim 1, wherein the conductive fiber filaments include a conductive fiber selected from the group consisting of carbon fiber, graphite fiber, boron fiber, SiC whisker, and alumina whisker.

7. The cleaning apparatus according to claim 1, wherein the conductive fiber filaments include an acrylic fiber containing dispersed copper sulphide particles.

8. The cleaning apparatus according to claim 1, wherein at least the tips of the conductive fiber filaments are arranged perpendicular to a surface of the probe card during cleaning.

9. The cleaning apparatus according to claim 8, wherein the gas supply mechanism supplies gas in a direction with a lateral orientation relative to a direction in which the tips of the conductive fiber filaments extend during cleaning.

* * * * *